(12) United States Patent
Suenaga et al.

(10) Patent No.: US 7,312,427 B2
(45) Date of Patent: Dec. 25, 2007

(54) HIGH-FREQUENCY DIELECTRIC HEATING DEVICE AND PRINTED BOARD WITH THERMISTOR

(75) Inventors: Haruo Suenaga, Katano (JP); Hideaki Moriya, Yamatokoriyama (JP); Shinichi Sakai, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 131 days.

(21) Appl. No.: 10/553,155

(22) PCT Filed: Apr. 21, 2004

(86) PCT No.: PCT/JP2004/005727

§ 371 (c)(1),
(2), (4) Date: Oct. 11, 2005

(87) PCT Pub. No.: WO2004/095886

PCT Pub. Date: Nov. 4, 2004

(65) Prior Publication Data

US 2006/0201937 A1    Sep. 14, 2006

(30) Foreign Application Priority Data

Apr. 22, 2003 (JP) .............................. 2003-117072
Apr. 22, 2003 (JP) .............................. 2003-117073

(51) Int. Cl.
*H05B 6/68* (2006.01)
(52) U.S. Cl. .................. 219/710; 219/716; 340/590
(58) Field of Classification Search ................. 219/710, 219/716, 715, 720, 721, 704, 705, 601, 626, 219/627, 680, 714; 363/131, 20, 21; 323/320, 323/325, 345, 349, 351; 340/590, 598, 548, 340/589, 679, 584; 361/18, 94, 103, 704; 315/207, 223, 283

See application file for complete search history.

(56) References Cited

U.S. PATENT DOCUMENTS 4,317,976 A * 3/1982 Noda ......................... 219/714

(Continued)

FOREIGN PATENT DOCUMENTS

EP    0 301 805 A1    2/1989

(Continued)

OTHER PUBLICATIONS

Patent Abstracts of Japan, vol. 0151, No. 6 (E-1044), JP 2 312182 A, Dec. 1990 (Cited on ISR).

(Continued)

*Primary Examiner*—Quang Van
(74) *Attorney, Agent, or Firm*—Pearne & Gordon LLP

(57) ABSTRACT

A high-frequency dielectric heating device includes: a microwave output unit including an inverter unit using a semiconductor switching element, heat-radiating fins for radiating the heat generated by an IGBT, and a printed board having a thermistor for detecting the temperature of the semiconductor switching element, The thermistor is soldered to a leg portion of the semiconductor switching element or near to the leg portion thereof on the side of the soldering surface of the printed board. The device also includes: a booster transformer, a high-voltage rectifier unit, and a magnetron; and a heat-cooking chamber fed with microwaves radiated from the magnetron. When the thermistor has assumed a predetermined resistance, a power-down control operation is effected by greatly decreasing the power fed to the semiconductor switching element. Then, permitting the power fed to the semiconductor switching element to vary depending upon the resistance of the thermistor.

10 Claims, 13 Drawing Sheets

U.S. PATENT DOCUMENTS

| | | | | |
|---|---|---|---|---|
| 4,967,051 | A | * | 10/1990 | Maehara et al. ............ 219/721 |
| 4,988,922 | A | * | 1/1991 | Shoda et al. ................. 315/223 |
| 5,012,058 | A | * | 4/1991 | Smith ......................... 219/716 |
| 5,274,208 | A | | 12/1993 | Noda |
| 5,548,101 | A | | 8/1996 | Lee |
| 6,759,964 | B2 | * | 7/2004 | Sato et al. .................. 340/590 |

FOREIGN PATENT DOCUMENTS

| | | |
|---|---|---|
| JP | 2-312182 | 12/1990 |
| JP | 3-71589 | 3/1991 |
| JP | 4-84026 | 3/1992 |
| JP | 4-179092 | 6/1992 |
| JP | 07-297695 | 10/1995 |
| JP | 2892454 | 2/1999 |
| JP | 11-297461 | 10/1999 |
| JP | 2003-100433 | 4/2003 |

OTHER PUBLICATIONS

Patent Abstracts of Japan, vol. 0163, No. 2, (M-1275), JP 4 084025 A, Mar. 1992 (Cited on ISR).

* cited by examiner

HIGH-FREQUENCY DIELECTRIC HEATING DEVICE AND PRINTED BOARD WITH THERMISTOR

TECHNICAL FIELD

The present invention relates to high-frequency dielectric heating by using a magnetron like in a microwave oven and, particularly, to protecting a semiconductor switching element such as IGBT (insulated gate bipolar transistor) used in an inverter from being overheated.

Additionally, the present invention also relates to a thermistor for protecting a semiconductor switching element used in an inverter from being overheated.

BACKGROUND ART

FIG. 9 is a diagram illustrating the constitution of a conventional power source for driving a magnetron. In FIG. 9, an alternating current from a commercial power source 11 is rectified into a direct current through a rectifier circuit 13, is smoothed through a choke coil 14 and a smoothing capacitor 15 on the output side of the rectifier circuit 13, and is fed to the input side of the inverter 16. The direct current is converted into a desired high frequency (e.g., 20 to 40 kHz) by turning the IGBT in the inverter 16 on and off. The inverter 16 is driven by the IGBT that switches the direct current at a high speed and by an inverter control circuit 161 that drives and controls the IGBT, whereby a current flowing through the primary side of a booster transformer 18 is switched to be on/off at a high speed.

Input signals to the control circuit 161 are detected by detecting a primary side current of the rectifier circuit 13 by using a CT 17, and the detected signals are input to the inverter control circuit 161 and are used for controlling the power of the inverter 16. Further, a temperature sensor (thermistor) 9' is attached to the cooling fins for cooling the IGBT, and the temperature data detected by the temperature sensor are input to the inverter control circuit 161 to control the inverter 16.

In the booster transformer 18, a high-frequency voltage output from the inverter 16 is applied to the primary winding 181, and a high voltage proportional to a turn ratio is obtained on the secondary winding 182. Further, a winding 183 of a small number of turns is provided on the secondary side of the booster transformer 18 and is used for heating a filament 121 of a magnetron 12. The secondary winding 182 of the booster transformer 18 has a voltage doubler half-wave rectifier circuit 19 for rectifying the output thereof. The voltage doubler half-wave rectifier circuit 19 is constituted by a high-voltage capacitor 191 and two high-voltage diodes 192 and 193.

Here, such troubles may often happen that the microwave Oven is placed being in touch with the wall causing the ventilation port to be closed, or a foreign matter such as a chopstick or the like is bit by a cooling fan of the microwave oven, causing the cooling fan to be locked.

In order to prevent the IGBT for switching the inverter power source from being thermally broken down under the above situations, it has heretofore been attempted to halt the semiconductor IGBT by using a thermistor before it is thermally broken down or to decrease the power to prevent a rise in the temperature.

In this case, the temperature is detected by attaching the thermistor in a manner of:

(1) Fastening the thermistor together with a package by using a thermistor lead plug U with a spectacle terminal, which, however, can only be done by the manual work by a man resulting in an increase in the number of the steps and an increase in the cost;

(2) Inserting a radial thermistor in the leg of the IGBT, the radial thermistor being attached to the leg of the IGBT in only a subsequent step requiring manual labor, resulting in an increase in the number of steps, and being directly affected by the cooling air deteriorating the thermal time constant of the thermistor; or (3) Fastening the thermistor to the heat-radiating fins by using separate screws to detect the temperature from the heat-radiating fins similarly resulting in an increase in the number of steps due to tightening the screws and an increase in the cost. Besides, the temperature is not directly detected from the IGBT but is detected through the heat-radiating fins, and both the detection precision and the sensitivity are not favorable.

Japanese Patent No. 2892454 (Patent Document 2) discloses an example of (2). FIG. 13B is a view illustrating a mounting method disclosed in the Patent Document 2. In FIG. 13B, reference numeral 306 denotes a printed board, 307 denotes heat-radiating fins, 308 denotes an IGBT, and 309' denotes a thermistor. In this method, the radial thermistor is attached near to the printed board in a subsequent step requiring manual labor, resulting in an increase in the number of steps, and being directly affected by the cooling air, deteriorating the thermal time constant of the thermistor.

JP-A-2-312182 (Patent Document 1) also discloses an example of (3). FIG. 13A is a view illustrating a mounting method disclosed in the patent document 1 and illustrates a state where a thermistor is fastened to the heat-radiating fins by screws. In FIG. 13A, reference numeral 306 denotes a printed board, 307 denotes heat-radiating fins, 308 denotes an IGBT, and 309' denotes a thermistor.

A heat-radiating portion of the IGBT 308 that generates a high temperature is secured to the heat-radiating fins 307, and its three legs are inserted in the through holes in the printed board and are soldered on the opposite side. Similarly, the thermistor 309' is fastened by a screw to the heat-radiating fins 307 to take out the temperature data of the heat-radiating fins.

However, the method of fastening to the heat-radiating fins by screws also results in an increase in the number of steps and in an increase in the cost. Besides, the temperature is not detected directly from the IGBT but is detected from the heat-radiating fins, and both the detection precision and the sensitivity are not favorable.

Therefore, the present applicant has given attention to that the heat-radiating portion of the IGBT that generates high temperatures is secured to the heat-radiating fins and that the three legs thereof are inserted in the through holes of the printed board and are soldered on the opposite side (back side or the soldered side), and have discovered that when a chip thermistor is soldered to the leg portion of the IGBT or near to the leg portion thereof on the soldering side, particularly, on the emitter side, the thermistor which is a chip is quickly mounted by an automatic machine. The applicant has further discovered that the thermistor has a high thermal conductivity for the junction temperature of the IGBT, a small time constant, and directly receives a current flowing through the leg of the IGBT making it possible to detect the temperature that is dependent on the junction temperature of the IGBT with a short time constant (i.e., maintaining a high following performance), and that the thermistor is mounted not on the side of the cooling fins but on the soldering surface on the back side of the printed board without almost affected by the cooling air, which is convenient. Further, what makes a feature is that a chip thermister having a small heat capacity is attached to the leg portion of the IGBT having a small heat capacity or to a portion near the leg portion thereof featuring a small thermal time constant and enabling the power-down control to be accomplished at a high speed.

The conventional control circuit for controlling the IGBT, on the other hand, is employing the above thermistor arranged in a customary manner, having a large thermal time constant, and is not capable of conducting a quick control operation. Besides, the control circuit itself is not such that the temperature data of the thermistor are input to the inverter control circuit as will be described later, but are input to a central microcomputer to control the temperature.

FIGS. 10A and 10B are diagrams illustrating a circuit for controlling the start of a magnetron, wherein FIG. 10A is a circuit diagram and FIG. 10B is a diagram illustrating the operation of a comparator.

In FIG. 10A, a terminal (A) which is one of the two input terminals of a comparator CO1 receives a potential at a point P3 at where the collector voltage of the IGBT is divided by the voltage-dividing resistors R3 and R4, and the other terminal (B) receives 3 V since the switch S1 at the start is on the side of the terminal a. After the magnetron is heated and stabilized to assume a steady state, the change-over switch S1 is changed over to the side of the terminal b, and the terminal (B) receives a potential at a point Pc at where the voltage Vcc is divided by the voltage-dividing resistors R1 and R2.

Therefore, the circuit is turned off when the potential at the point P3 is smaller than 3 V at the start, and is turned on when the potential is higher than 3 V to repeat the turn on/off operation. Based on this data, the inverter control circuit 161 controls the ON/OFF duty of IGBT such that the potential at P3 becomes nearly in agreement is with 3 V, and the collector voltage of the IGBT becomes lower than that of during the steady-state operation.

During the steady-state operation, however, the terminal (B) of the comparator CO1 receives a potential Pc which is very higher than 3 V of at the start. Therefore, the inverter control circuit 161 works to increase the ON duty of ON/OFF control of IGBT so that the potential P3 becomes nearly in agreement with the potential Pc, and the collector voltage, too, of IGBT is elevated.

Here, however, though not illustrated, an increase in the ON duty is limited by the power control function which is possessed by the inverter control circuit 161 and works based on other input signals (e.g., input current data illustrated in the related art). As illustrated in FIGS. 10A and 10B, therefore, the potential Pc is maintained to be higher than the potential P3 at all times, and the output of the comparator CO1 is maintained to be turned on at all times.

As described above, the circuit for controlling the start of the magnetron of FIGS. 10A and 10B prevents an excess of voltage from being applied to the magnetron by controlling the collector voltage of IGBT to a predetermined value during the period (i.e., at the start) after the start of operation of the inverter circuit until the magnetron starts oscillating while flowing a heating current to the filament of the magnetron.

As will be described later, the power-down control of the invention utilizes the circuit for controlling the start of the magnetron of FIGS. 10A and 10B.

In case the fan suddenly stops revolving due to foreign matter that has bit the fan due to some cause, it was so far judged that the device has become faulty and the cooking had to be interrupted causing great psychological uneasiness to a person who is cooking to feel that the device has become faulty.

BRIEF DESCRIPTION OF THE DRAWINGS

FIGS. 3A and 3B are diagrams illustrating a first power-down control system according to the invention, wherein FIG. 3A is a circuit diagram and FIG. 3B is a diagram illustrating the operation of a comparator;

FIGS. 4A and 4B are diagrams illustrating a second power-down control system according to the invention, wherein FIG. 4A is a circuit diagram and FIG. 4B is a diagram illustrating the operation of a comparator;

FIGS. 5A and 5B are diagrams illustrating a third power-down control system according to the invention, wherein FIG. 5A is a circuit diagram and FIG. 5B is a diagram illustrating the operation of a comparator;

FIGS. 8A and 8B are diagrams illustrating a fourth power-down control system according to the invention, wherein FIG. 8A is a circuit diagram and FIG. 8B is a diagram illustrating the operation of a comparator;

FIGS. 10A and 10B are views illustrating a start control circuit for the magnetron, wherein FIG. 10A is a circuit diagram and FIG. 10B is a diagram illustrating the operation of a comparator;

FIGS. 13A and 13B are views of a conventional printed board illustrating a state of mounting a thermistor, wherein FIG. 13A is a front view of a printed board with a thermistor described in the patent document 1, and FIG. 13B is a perspective view of a printed board with a thermistor described in the patent document 2.

Figure 1:
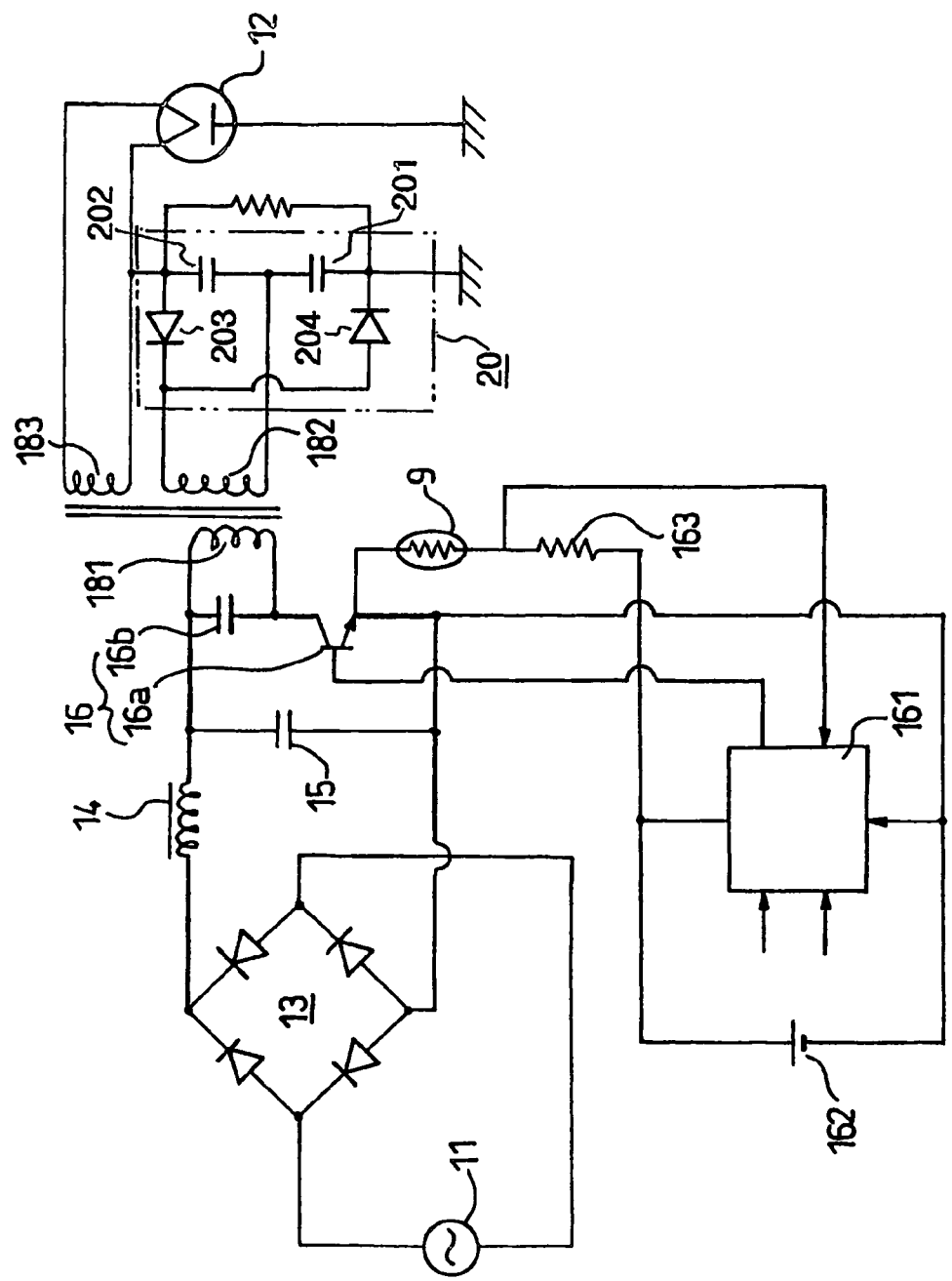
FIG. 1 is a diagram illustrating the constitution of a power source for driving a magnetron with a thermistor according to the invention.

In the drawings, a reference numeral 7 refers to heat-radiating fins; 8 to an IGBT; 9 to a thermistor; 11 to a commercial power source; 12 to a magnetron; 13 to a rectifier circuit; 14 to a choke coil; 15 to a smoothing capacitor; 16 to an inverter; 161 to an inverter control circuit; 18 to a booster transformer; 181 to a first winding; 182 to a second winding; 183 to a winding for heating filament; 19 to a voltage doubler half-wave rectifier circuit; 307 to heat-radiating fins; 308 to a IGBT; and 309 to a thermistor.

DISCLOSURE OF INVENTION

This invention solves the above problem, and enables the cooking to be continued even in case the fan has suddenly stopped revolving due to foreign matter that has bit the fan by giving attention to that the IGBT is not easily broken down by the heat. Namely, the power is decreased down to about one-half when the temperature of the IGBT increases to approach a value at which the IGBT may be thermally broken down, and a cooking person may simply feel that the heating speed is becoming slightly mild but continues the cooking without feeling uneasiness.

This invention was accomplished in order to solve the above problems. Namely, according to one aspect of the invention, there is provided a high-frequency dielectric heating device for heat-treating a material to be heated, comprising:

a microwave output unit including an inverter unit for inverting a direct current into an alternating current of a predetermined frequency by switching a semiconductor switching element by using an inverter control circuit, heat-radiating fins on which the semiconductor switching element is mounted to radiate the heat generated by the semiconductor switching element, a printed board having a thermistor for detecting the temperature of the semiconductor switching element, the thermistor being soldered to a leg portion of the semiconductor switching element or near to the leg portion thereof on the side of the soldering surface of the printed board, a booster transformer for boosting the output voltage of the inverter unit, a high-voltage rectifier unit for doubling and rectifying the output voltage of the booster transformer, and a magnetron for radiating the output of the high-voltage rectifier unit as microwaves; and a heat-cooking chamber fed with microwaves radiated from the magnetron;

wherein the inverter unit has a power-down control function for permitting the output power of the inverter unit to vary depending upon the resistance of the thermistor after the start of the magnetron.

According to a second aspect of the invention, there is provided a high-frequency dielectric heating device for heat-treating a material to be heated, comprising:

a microwave output unit including an inverter unit for inverting a direct current into an alternating current of a predetermined frequency by switching a semiconductor switching element by using an inverter control circuit, heat-radiating fins on which the semiconductor switching element is mounted to radiate the heat generated by the semiconductor switching element, a printed board having a thermistor for detecting the temperature of the semiconductor switching element, the thermistor being soldered to a leg portion of the semiconductor switching element or near to the leg portion thereof on the side of the soldering surface of the printed board, a booster transformer for boosting the output voltage of the inverter unit, a high-voltage rectifier unit for doubling and rectifying the output voltage of the booster transformer, and a magnetron for radiating the output of the high-voltage rectifier unit as microwaves; and a heat-cooking chamber fed with microwaves radiated from the magnetron;

wherein the inverter unit has a power-down control function for decreasing the output power of the inverter unit down to a predetermined value when the thermistor has assumed a predetermined resistance.

A third aspect of the invention is concerned with a high-frequency dielectric heating device of the above second aspect, wherein the inverter unit is provided with a start control circuit which, at the start of the magnetron, controls the collector voltage of the semiconductor switching element to be lower than that of during the steady-state operation, and the start control circuit is utilized when the output power of the inverter unit is to be decreased down to a predetermined value.

According to a fourth aspect of the invention, there is provided a high-frequency dielectric heating device for heat-treating a material to be heated, comprising:

a microwave output unit including an inverter unit for inverting a direct current into an alternating current of a predetermined frequency by switching a semiconductor switching element by using an inverter control circuit, heat-radiating fins on which the semiconductor switching element is mounted to radiate the heat generated by the semiconductor switching element, a printed board having a thermistor for detecting the temperature of the semiconductor switching element, the thermistor being soldered to a leg portion of the semiconductor switching element or near to the leg portion thereof on the side of the soldering surface of the printed board, a booster transformer for boosting the output voltage of the inverter unit, a high-voltage rectifier unit for doubling and rectifying the output voltage of the booster transformer, and a magnetron for radiating the output of the high-voltage rectifier unit as microwaves; and a heat-cooking chamber fed with microwaves radiated from the magnetron;

wherein the inverter unit has a power-down control function for decreasing the output power of the inverter unit down to a predetermined value when the thermistor has assumed a predetermined resistance and, then, for permitting the output power of the inverter unit to vary depending upon the resistance of the thermistor.

A fifth aspect of the invention is concerned with a high-frequency dielectric heating device of any one of the above first to fourth aspects, wherein the output power of the inverter unit is decreased down to a predetermined value when the thermistor has assumed the predetermined resistance.

In a sixth aspect, the invention is concerned with a printed board with a thermistor comprising an inverter unit for inverting a direct current into an alternating current of a predetermined frequency by switching a semiconductor switching element, heat-radiating fins on which the semiconductor switching element is mounted to radiate the heat generated by the semiconductor switching element, and a thermistor for detecting the temperature of the switching element, wherein the thermistor is soldered to a leg portion of the switching element or near to the leg portion thereof exposed on the side of the soldering surface of the printed board.

In a seventh aspect, the invention is concerned with a printed board with a thermistor of the sixth aspect, wherein the semiconductor switching element is an IGBT (insulated gate bipolar transistor).

In a eighth aspect, the invention is concerned with a printed board with a thermistor of the seventh aspect, wherein the leg portion is an emitter leg of the IGBT.

In a ninth aspect, the invention is concerned with a printed board with a thermistor according to any one of the first to eighth aspects, wherein the thermistor is a chip thermistor.

In a tenth aspect, the invention is concerned with a high-frequency dielectric heating device for heat-treating a material to be heated, comprising:

a microwave output unit including a printed board mounting an inverter unit, heat-radiating fins and a thermistor, a booster transformer for boosting the output voltage of the inverter unit, a high-voltage rectifier unit for doubling and rectifying the output voltage of the booster transformer, and a magnetron for radiating the output of the high-voltage rectifier unit as microwaves; and a heat-cooking chamber for containing a material to be heated thereby to heat-treat the material to be heated by feeding the microwaves radiated from the magnetron into the heat-cooking chamber;

wherein the inverter unit is the one mounted on a printed board with a thermistor according to any one of the first to ninth aspects.

According to the invention as described above, the thermistor is a chip which can be quickly mounted by using an automatic machine. Besides, the thermistor directly receives a current flowing through the leg of the IGBT making it possible to detect a value close to the junction temperature of the IGBT.

Further, the thermistor is mounted not on the side of the heat-radiating fins but on the soldering surface on the back side of the printed board without affected by the cooling air. Moreover, the cost is not driven up unlike the prior method.

BEST MODE FOR CARRYING OUT THE INVENTION

FIG. 1 is a diagram illustrating the constitution of a power source for driving a magnetron according to the invention. In FIG. 1, an alternating current from a commercial power source 11 is rectified into a direct current through a rectifier circuit 13, smoothed through a choke coil 14 and a smoothing capacitor 15 on the output side of the rectifier circuit 13, and is fed to the input side of an inverter 16. The direct current is converted into a desired high frequency (20 to 40 kHz) by turning a semiconductor switching element IGBT in the inverter 16 on and off. The inverter 16 is driven by an IGBT 16a which switches the direct current at a high speed and by an inverter control circuit 161 which controls the IGBT 16a, and a current flowing through the primary side of a booster transformer 18 is switched to be turned on/off at a high speed.

In the booster transformer 18, a high-frequency voltage output from the inverter 16 is applied to the primary winding 181, and a high voltage proportional to a turn ratio is obtained on the secondary winding 182. Further, a winding 183 of a small number of turns is provided on the secondary side of the booster transformer 18 and is used for heating a filament 121 of a magnetron 12. The secondary winding 182 of the booster transformer 18 has a voltage doubler full-wave rectifier circuit 20 for rectifying the output thereof. The voltage doubler full-wave rectifier circuit 20 is constituted by high-voltage capacitors 201, 202 and two high-voltage diodes 203 and 204.

In this invention, a feature resides in that the thermistor 9 for detecting the temperature of the IGBT 16a is not attached to the heat-radiating fins in a conventional manner, but is directly attached to a leg portion of the IGBT 16a or to a portion close to the leg portion thereof. Besides, the leg portion is an emitter leg, and the chip thermistor is soldered onto the soldering surface on the back is side of the printed board 6 instead of the side of the heat-radiating fins.

The temperature data obtained by the thermistor is input to the inverter control circuit 161 to control the inverter 16.

Figure 2:
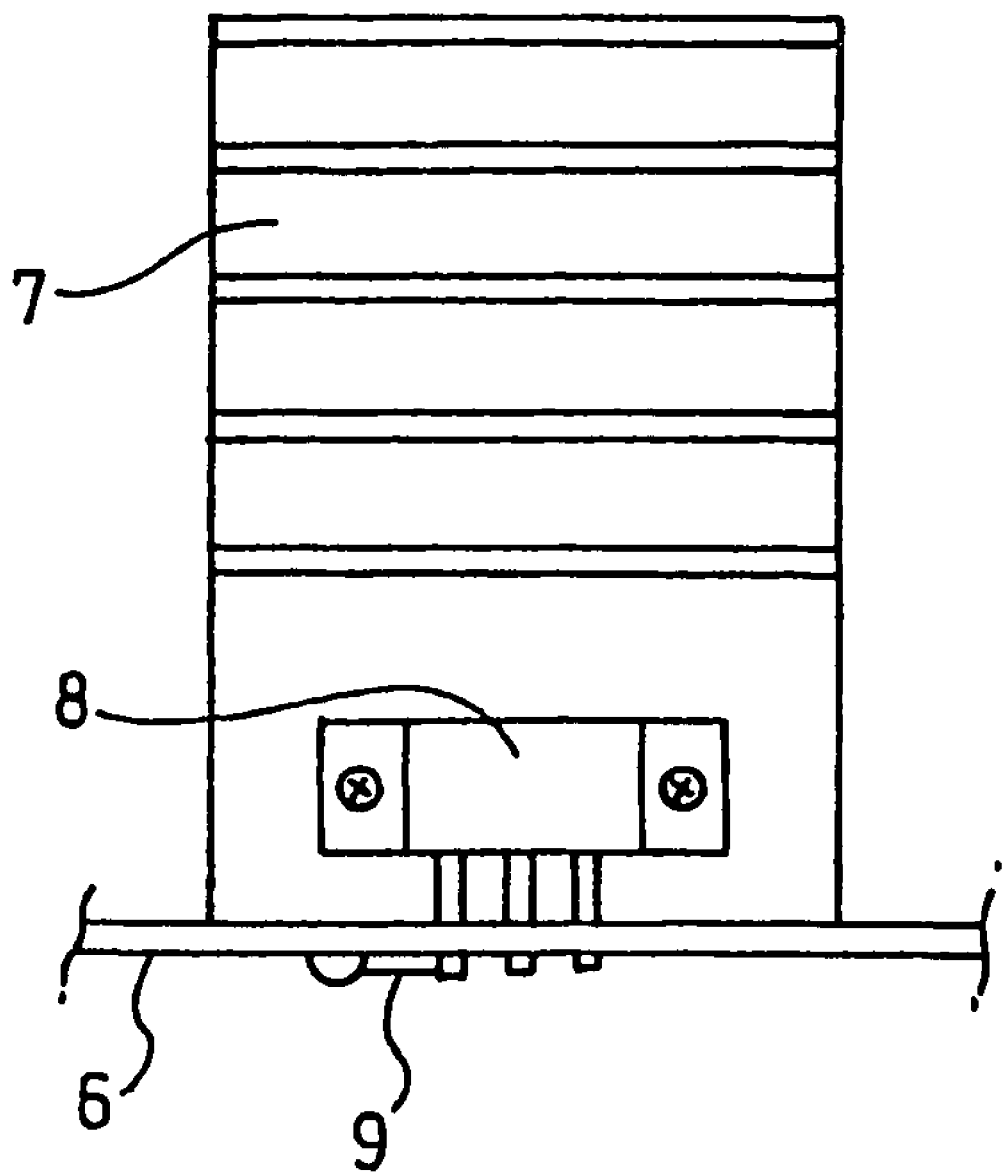
FIG. 2 is a view illustrating a printed board according to the invention.

FIG. 2 illustrates a printed board according to the invention. In FIG. 2, reference numeral 7 denotes heat-radiating fins, 8 denotes the IGBT and 9 denotes the thermistor.

The heat-radiating portion of the IGBT 8 that generates a high temperature is secured to the heat-radiating fins 7, and three legs thereof are inserted in the through holes in the printed board and are soldered on the opposite side (back side, soldering side). The thermistor 9 is a chip thermistor which is directly soldered to the leg of the IGBT 16a on the soldering surface on the back side of the printed substrate 6.

Described below is the power-down control operation according to the invention using the thermistor.

(1) According to the power-down control operation after detected of the invention, the power is not interrupted even when the IGBT temperature has reached the detection temperature but, instead, the power is, first, decreased down to a first predetermined value (e.g., about one-half). Then, when the IGBT temperature further decreases down to be lower than the detection temperature, the power is returned back is again to the predetermined value. When the IGBT temperature rises and reaches the detection temperature, the power is decreased down again. This operation is repeated to maintain the detection temperature.

(2) A predetermined control width signal is generated at all times from the microcomputer side, the IGBT temperature is detected by the thermistor on the inverter side, and the detected value is sent to the inverter control circuit to so control the inverter as to lower the IGBT temperature.

(3) A thermistor is inserted in one side of the resistance-dividing circuit to effect the gradual control based on the dividing ratio of when the thermistor has detected the over-heated temperature.

(4) In the gradual control, the operation is effected to gradually lower the target value when a predetermined point is reached, and this operation is repeated. The cycle of this control operation is short, i.e., about 1 to about 2 seconds. As described earlier, this control is made possible, for the first time, since the thermal time constant is made small by providing the chip thermistor on the back side of the terminals of the IGBT.

In case the fan suddenly stops revolving due to foreign matter that has bit the fan due to some cause, it was so far judged that the device has become faulty and the cooking had to be interrupted. According to this invention, however, attention is given to that the IGBT is not easily broken down by the heat despite the fan becomes defective. Namely, the cooking is continued and the power is decreased down to about one-half when the temperature of the IGBT increases to approach a value at which the IGBT may be thermally broken down, making a great difference. It was confirmed that the IGBT is not thermally broken down by the above operation. Then, a person who is ordinarily cooking may simply feel that the heating speed has become slightly mild but continues the cooking without feeling such psychological uneasiness that the device has broken down.

The power-down control operation executed by the invention will now be concretely described with reference to the drawings.

First Embodiment

Figure 3A:
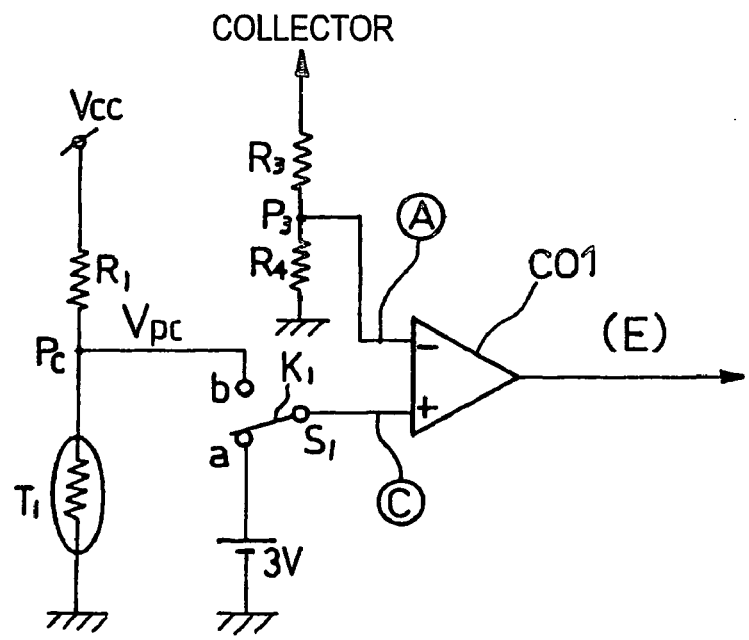
Figure 3B:
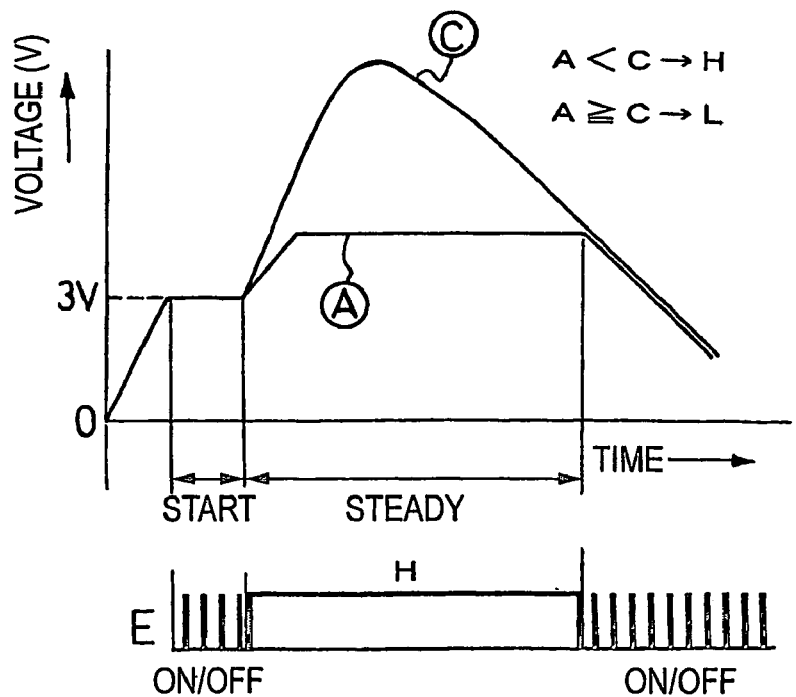

FIG. 3 are diagrams illustrating a first power-down control system according to the present invention, wherein FIG. 3A is a circuit diagram and FIG. 3B is a diagram illustrating the operation of a comparator.

In FIG. 3A, a terminal (A) which is one of the two input terminals of a comparator CO1 receives a potential at a point P3 at where the collector voltage of the IGBT is divided by the voltage-dividing resistors R3 and R4, and the other terminal (C) receives 3 V since the switch S1 at the start is on the side of the terminal a. After the magnetron is heated and assumes a steady state, the change-over switch S1 is changed over to the side of the terminal b, and the terminal (C) receives a potential at a point Pc at where the voltage Vcc is divided by the voltage-dividing resistor R1 and by the thermistor T1 as described earlier.

Figure 10A:
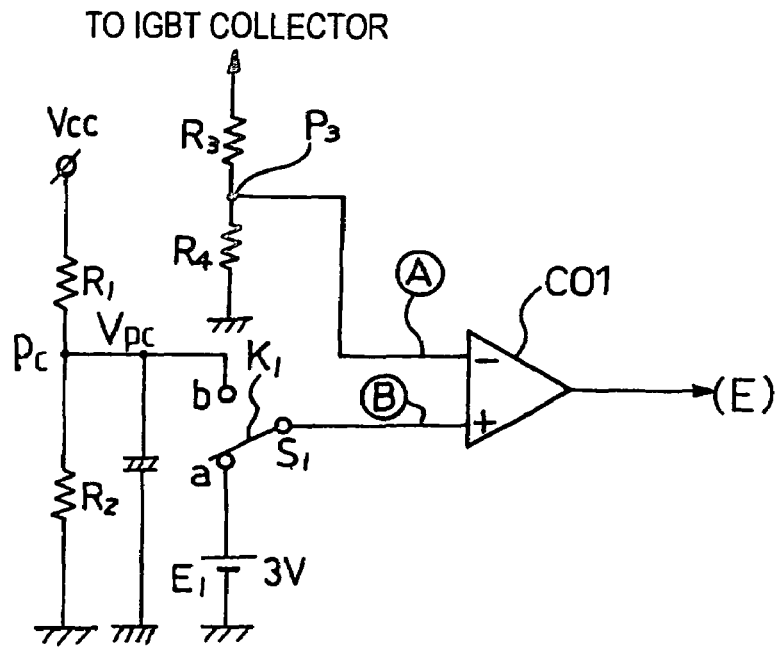
Figure 10B:
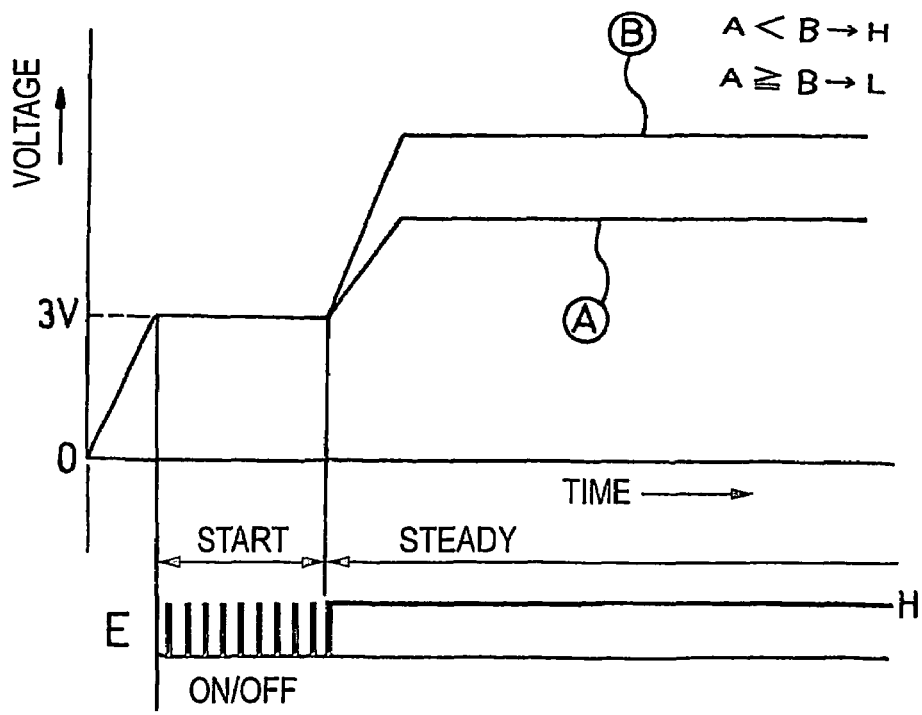

Here, what makes a difference from the start control circuit of FIG. 10A is that the potential at the point Pc at where the voltage Vcc is divided by the voltage-dividing resistor R1 and the thermistor T1 is input (in FIGS. 10A and 10B, the potential is divided by the voltage-dividing resistors R1 and R2). The thermistor has such a characteristic that the resistance decreases with an increase in the temperature. As represented by (c) in FIG. 3B, therefore, the collector voltage gradually decreases after a predetermined detection temperature of the thermistor is detected. At the start, the inverter control circuit 161 controls the ON/OFF duty of IGBT based on the ON/OFF data of the comparator CO1 so that the potential at P3 becomes nearly in agreement with 3 V. Therefore, the collector voltage of the IGBT becomes lower than that of during the steady state operation. During the steady-state operation, the terminal (C) of the comparator CO1 receives a potential Pc which is very higher than 3 V of at the start. Therefore, the inverter control circuit 161 works to increase the ON duty of ON/OFF control of IGBT so that the potential (A) at P3 becomes nearly in agreement with the potential (C) at Pc, and the collector voltage, too, of IGBT is elevated. Here, however, though not illustrated, an increase in the ON duty is limited by the power control function which is possessed by the inverter control circuit 161 and works based on other input signals (e.g., input current data illustrated in the related art). As illustrated in FIGS. 3A and 3B, therefore, the potential (C) at Pc is maintained to be higher than the potential (A) at P3 at all times, and the output of the comparator CO1 is maintained to be turned on at all times. As the IGBT is heated, however, the resistance of the thermistor T1 decreases. As the potential becomes equal to the potential (A) at P3, therefore, the ON/OFF operation starts again, and the inverter control circuit 161 lowers the ON duty of ON/OFF control of the IGBT so that the potential (A) at P3 decreases following a decrease in the potential (C) at Pc, and the inverter output decreases.

In the power-down control operation according to the first embodiment as described above, the output power of the inverter unit is permitted to vary depending upon the resistance of the thermistor that is in a steady state after the start of the magnetron. Therefore, even in case the fan has stopped revolving due to some cause, the power source is not interrupted unlike that of the related art, but the inverter unit is permitted to operate. When the temperature of the IGBT rises, the resistance of the thermistor decreases and the inverter output decreases. Therefore, a person who is cooking simply feels that the heating rate is slightly mild but is allowed to continue the cooking.

Second Embodiment

Figure 4A:
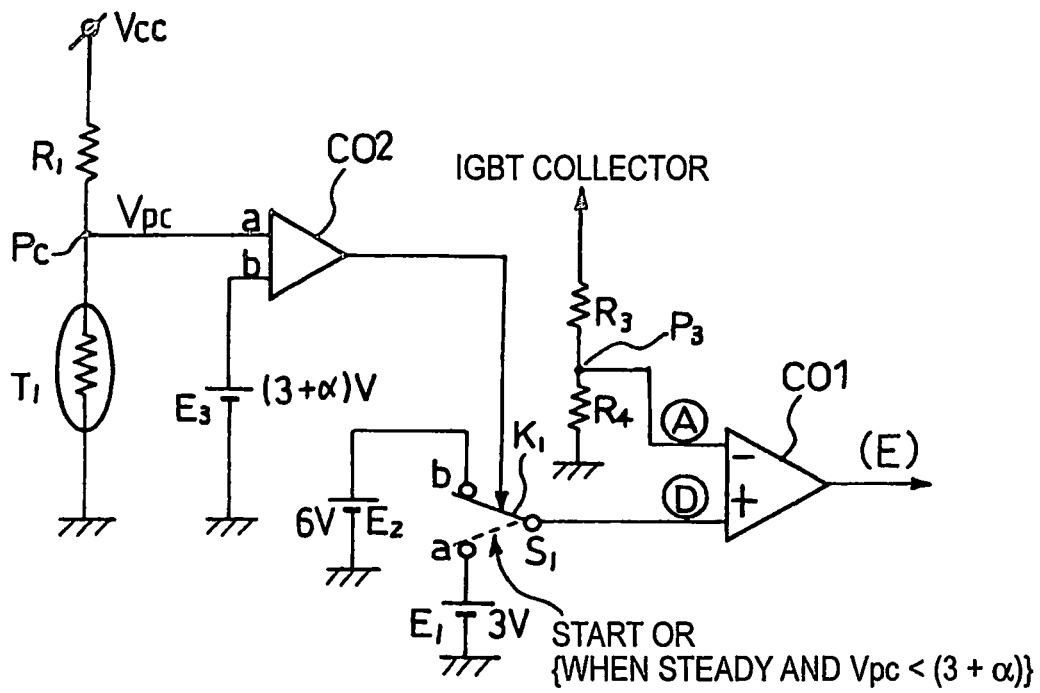
Figure 4B:
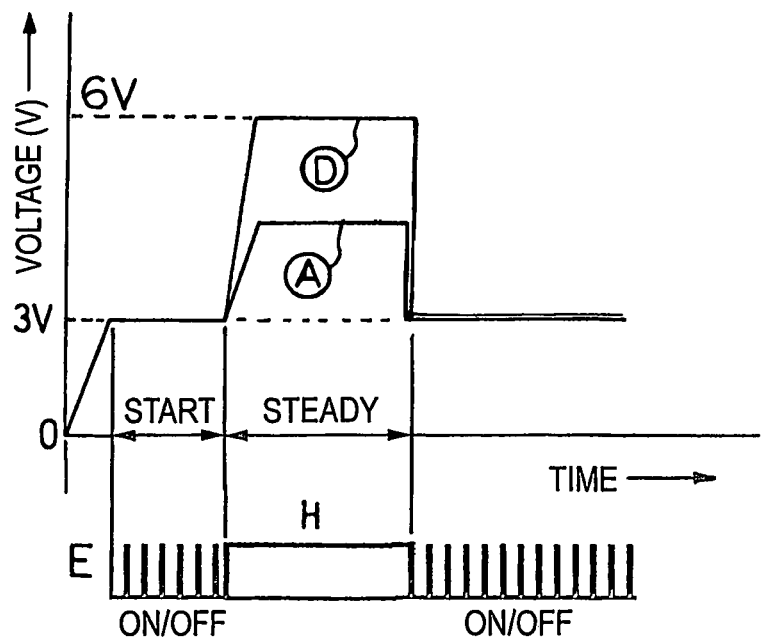

FIGS. 4A and 4B are diagrams illustrating a second power-down control system according to the invention, wherein FIG. 4A is a circuit diagram and FIG. 4B is a diagram illustrating the operation of a comparator.

In the second system, the circuit for limiting the collector voltage is not operated when the detection temperature of the thermistor is smaller than a predetermined value. As the predetermined value is exceeded, however, the circuit is operated to limit the collector voltage. Here, a feature resides in that the above start control circuit of FIG. 10A is utilized to limit the collector voltage.

In FIG. 4A, a terminal (A) which is one of the two input terminals of a comparator CO1 receives a potential at a point P3 at where the collector voltage of the IGBT is divided by the voltage-dividing resistors R3 and R4, and the other terminal (D) receives 3 V since the switch S1 at the start is on the side of the terminal a. After the magnetron is heated to assume a steady state, the change-over switch S1 is changed over to the side of the terminal b, and a voltage E2 (=6 V) is applied. Here, however, as the potential at a point Pc at where the voltage Vcc is divided by the voltage-dividing resistor R1 and by the thermistor T1 decreases to be smaller than (3+α) V due to a decrease in the resistance of the thermistor T1 accompanying an increase in the temperature of the IGBT, the change-over switch S1 is changed over again to the side of the terminal a, and 3 V is applied.

At the start, the inverter control circuit 161 controls the ON/OFF duty of IGBT based on the ON/OFF data of the comparator CO1 so that the potential at P3 becomes nearly in agreement with 3 V. Therefore, the collector voltage of the IGBT becomes lower than that of during the steady-state operation. During the steady-state operation, the inverter control circuit 161 works to increase the ON duty of ON/OFF control of IGBT so that the potential (A) at P3 becomes nearly in agreement with 6 V, and the collector voltage, too, of IGBT is elevated. Here, however, though not illustrated, an increase in the ON duty is limited by the power control function which is possessed by the inverter control circuit 161 and works based on other input signals (e.g., input current data illustrated in the related art). As illustrated in FIGS. 4A and 4B, therefore, the potential (A) at P3 becomes lower than 6 V at one input terminal (D) of the comparator at all times, and the output of the comparator CO1 is maintained to be turned on at all times. As the IGBT is heated, however, the resistance of the thermistor T1 decreases. As the potential Vpc at the point Pc becomes lower than the predetermined value (3+α) V, therefore, a moving contact K1 of the change-over switch S1 is changed from the side of the terminal b of 6 V over to the side of the terminal a of 3 V, to sharply decrease the potential at the + input terminal D of the comparator CO1 to start ON/OFF operation again. Then, the inverter control circuit 161 controls the ON/OFF duty of the IGBT based on the ON/OFF data of the comparator CO1 so that the potential at P3 becomes nearly in agreement with 3 V, and the inverter output greatly decreases.

In the power-down control operation according to the second embodiment as described above, the output power of the inverter unit is greatly decreased down to a first predetermined value when the thermistor has assumed a predetermined resistance. Therefore, even in case the fan has stopped revolving due to some cause, the power source is not interrupted unlike that of the related art, but the inverter unit continues to operate. When the resistance of the thermistor decreases down to a predetermined value accompanying a rise in the temperature of the IGBT, the inverter greatly decreases the output. Therefore, a person who is cooking simply feels that the heating rate has become slightly mild but is allowed to continue the cooking.

Third Embodiment

Figure 5A:
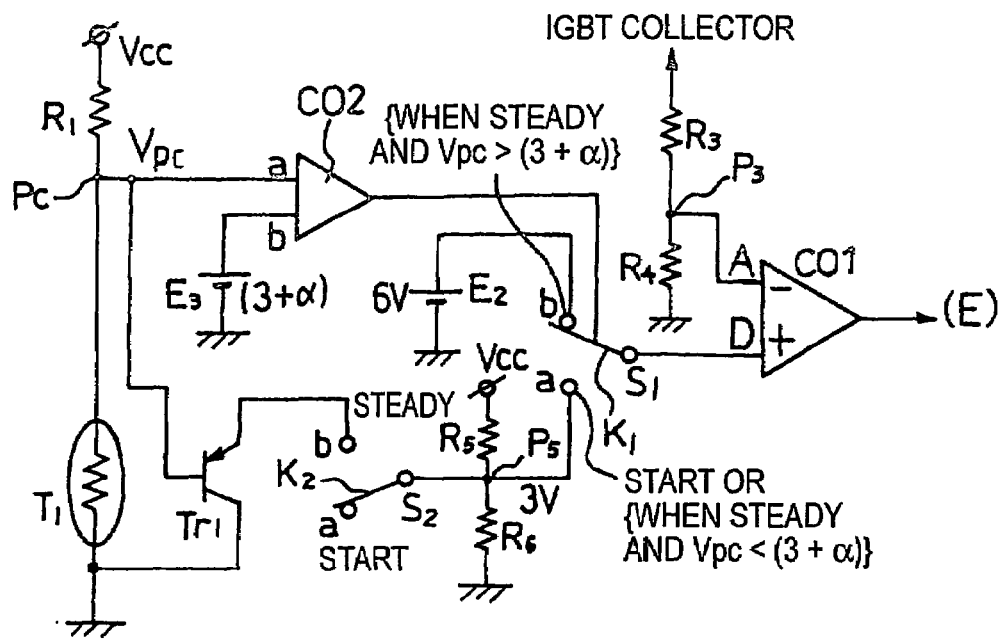
Figure 5B:
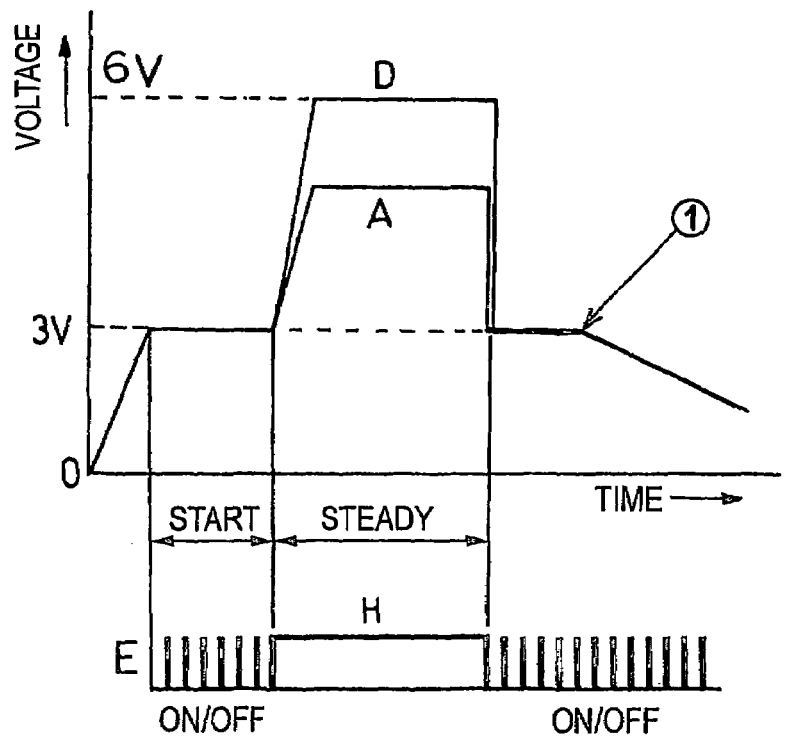

FIGS. 5A and 5B are diagrams illustrating a third power-down control system according to the invention, wherein FIG. 5A is a circuit diagram and FIG. 5B is a diagram illustrating the operation of a comparator.

The third system is a modification of the control operation of the second system. When the detection temperature of the thermistor is further raised, the reference signal of 3 V used in the second system is lowered according to the temperature detected by the thermistor.

In FIG. 5A, the moving contacts K1 and K2 of the change-over switches S1 and S2 at start are contacted to the side of the terminals a, and a potential 3 V at a point P5 at where Vcc is divided by the resistors R5 and R6 is input to the one input terminal D of a comparator CO1.

At the start, further, the other input terminal A of the comparator CO1 receives a potential at a point P3 at where the collector voltage of the IGBT is divided by the resistors R3 and R4. When a potential across the thermistor T1 is higher than E3 (3+α) V in the steady state, the moving contacts K1 and K2 of the switches S1 and S2 are contacted to the side of the terminals b.

When the potential Vpc across the thermistor T1 becomes lower than E3 (3+α) V in the steady state, the moving contact K1 of the switch S1 is shifted again to the side of the terminal a (at this moment, the transistor Tr1 is still turned off) whereby 3 V is applied, and the potential at the + input terminal D of the comparator C01 sharply decreases to start the ON/OFF operation again. Then, the inverter control circuit 161 controls the ON/OFF duty of the IGBT based on the ON/OFF data of the comparator CO1 so that the potential at P3 becomes nearly in agreement with 3 V, and the inverter output greatly decreases.

As the resistance of the thermistor T1 further decreases causing the transistor Tr1 to be turned on, the potential of the thermistor T1 is added in parallel with the resistor T6 through the emitter-base of the transistor Tr1. Thereafter, the inverter control circuit 161 lowers the ON duty in the ON/OFF control of the IGBT so that the potential (A) at P3 decreases following a decrease in the potential (C) at Pc. Therefore, the collector voltage of the IGBT further decreases.

In the power-down control operation according to the third embodiment as described above, the output power of the inverter unit is greatly decreased down to a predetermined value when the thermistor has assumed a predetermined resistance. When the thermistor has assumed another predetermined resistance (① in FIG. 5B), the output of the inverter unit is permitted to vary depending upon the resistance. Therefore, even in case the fan has stopped revolving due to some cause, the power source is not interrupted unlike that of the related art, but the inverter unit continues to operate. When the resistance of the thermistor decreases down to a predetermined value accompanying a rise in the temperature of the IGBT, the inverter greatly decreases the output and further continues to decrease the output. Therefore, a person who is cooking simply feels that the heating rate has become slightly mild but is allowed to continue the cooking.

In the conventional circuit, the power source is interrupted at one time as the temperature continues to sharply rise and becomes overheated. In this embodiment, however, the power is once greatly decreased to greatly reduce the temperature gradient. If the temperature still rises, then, the temperature gradient is further relaxed.

If it is attempted in the conventional circuit to decrease the output power as is done in this invention instead of interrupting the power source when overheated, then, this must be effected by using a central microprocessor. In order to effect this control using the central microcomputer in the conventional circuit, however, the control potential used by the inverter must be input to the microcomputer.

However, the control potential (emitter potential) used by the inverter is not the earth potential (0 V) but has a certain potential. Therefore, this control potential cannot be directly input to the microcomputer, and some inclusion must be used such as a photo-coupler.

Therefore, even if it is attempted to effect the power-down control as is done by this invention by using the conventional circuit, the response speed becomes slow and a correct control is not accomplished.

Figure 6:
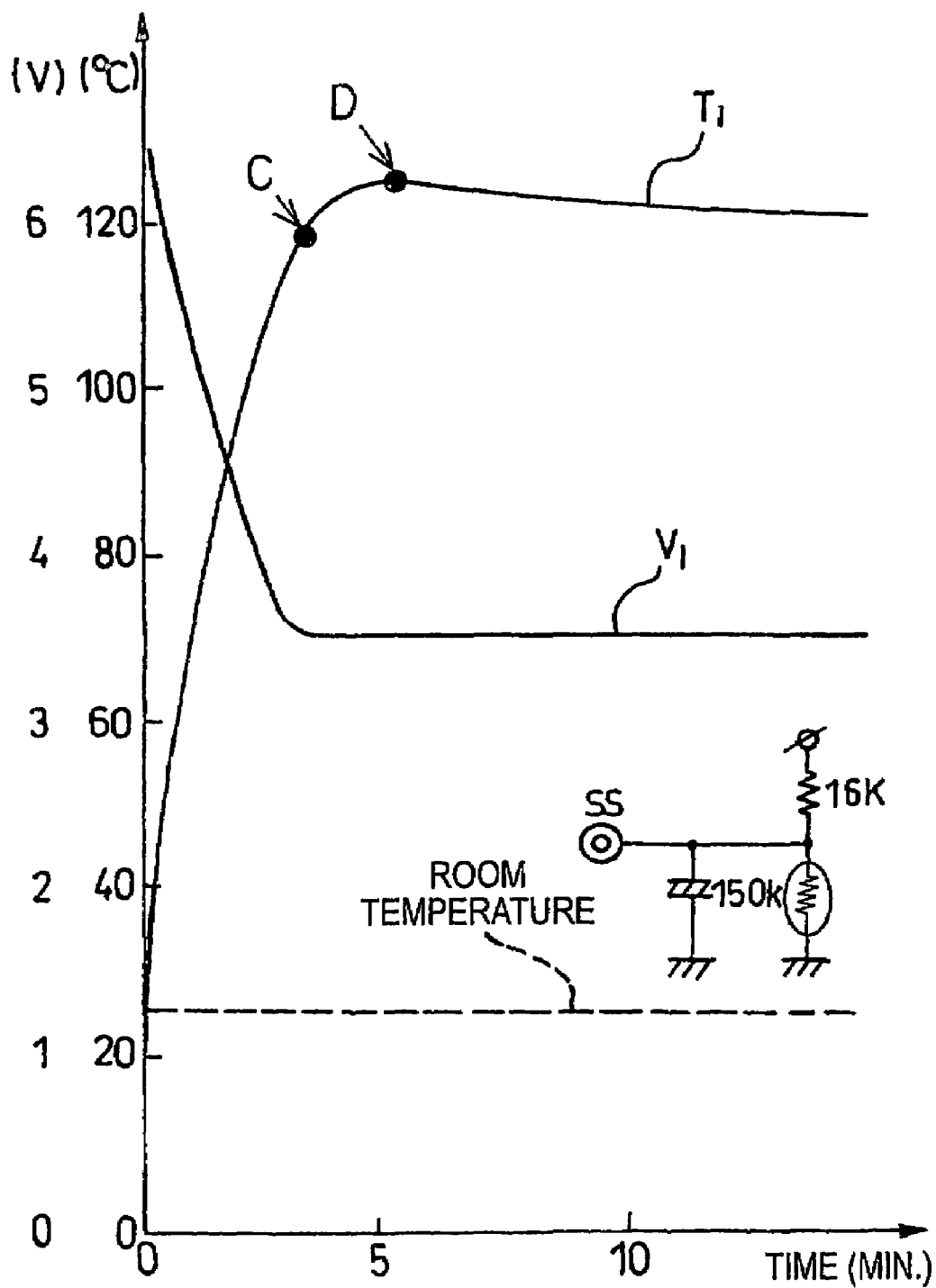
FIG. 6 is a graph illustrating the operation of a device according to the third control system of the invention of when the air intake port of a microwave oven is closed.
Figure 7:
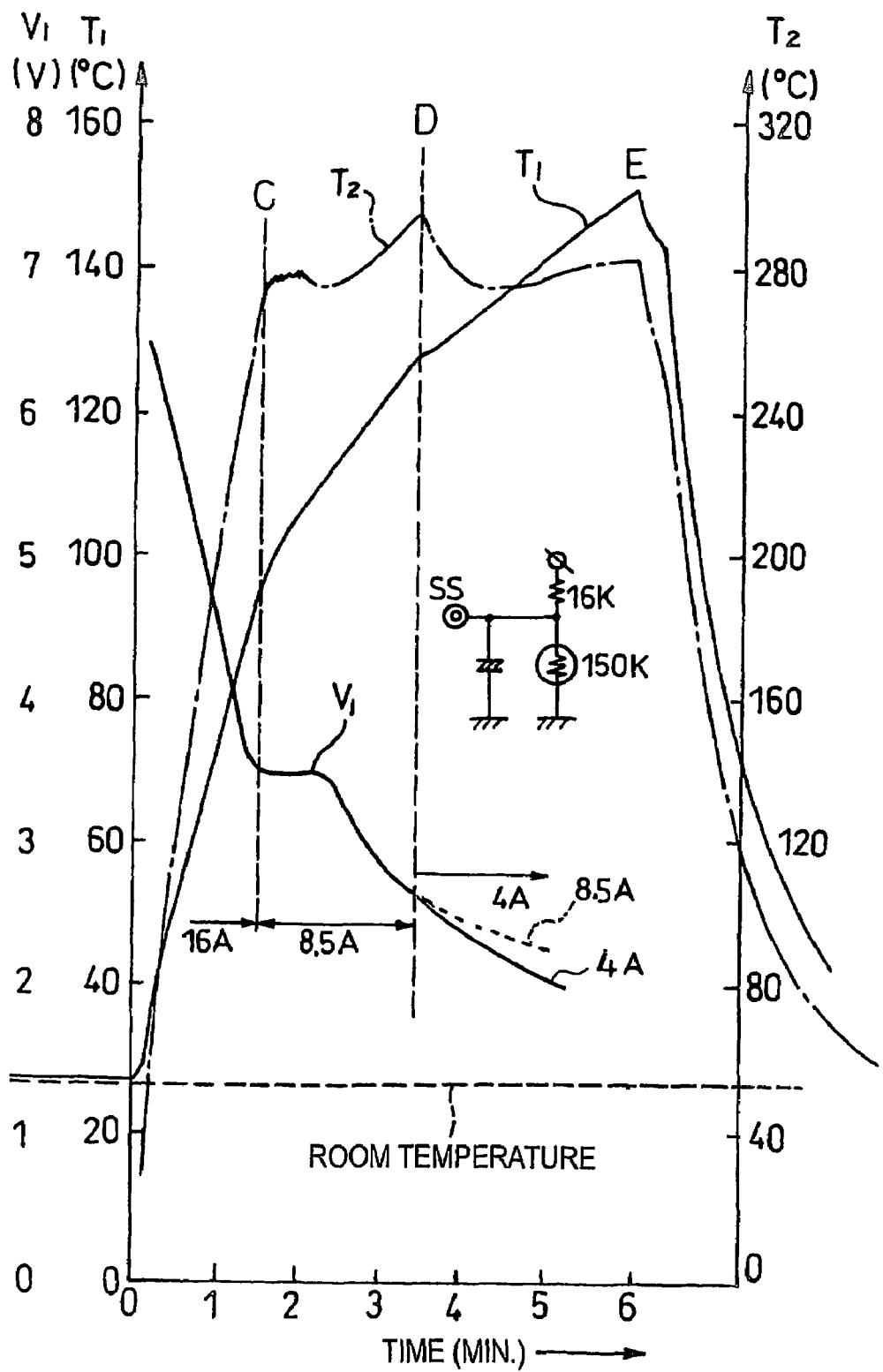
FIG. 7 is a graph illustrating the operation of the device according to the third control system of the invention of when the fan of the microwave oven is locked.

FIGS. 6 and 7 illustrate the experimental results of the power-down control system according to the invention.

FIG. 6 illustrates the experimental results based on the water load by using a third control system of the invention, closing the cooling air intake port and continuously producing a maximum output at 120 V/60 Hz.

As shown, the temperature detecting circuit using the thermistor which is a temperature sensor employs the power source Vcc and a series circuit of a resistor (16 kΩ) and a thermistor (150 kΩ), and V1 is a potential at a connection point SS. T1 is a temperature of the IGBT casing.

When the microwave oven is operated under the above conditions, T1 rises at a steep gradient but the resistance of the thermistor decreases. Therefore, when V1 becomes close to 3.5 V owing to the invention near a point C in the first stage from near 6.4 V in the steady state, the power fed to the IGBT is halved. Therefore, the gradient of the temperature T1 of the IGBT that was sharply rising at a steep gradient is greatly relaxed at the point C. The temperature of the IGBT still continues to rise though the gradient is relaxed. At a point D in the second stage, however, the value of the thermistor of the third system becomes an input to the comparator, and the temperature of the IGBT mildly varies at around 120° C. Therefore, the IGBT is not thermally broken down but continues to operate.

Even in a state where the air intake port of the microwave oven is closed, the invention gives attention to that the IGBT is not easily broken down by the heat. Besides, the thermistor detection portion of the invention has a small thermal time constant enabling the temperature to be quickly detected. The invention further continues the operation in the power-down control mode without readily halting the heating. Therefore, the user is allowed to continue the cooking without feeling uneasy though the cooking time may be slightly extended.

FIG. 7 illustrates the experimental results based on the water load by using the third control system of the invention, locking the cooling fan and continuously producing a maximum output at 120 V/60 Hz. As shown, the temperature detecting circuit using the thermistor which is a temperature sensor employs the power source Vcc and a series circuit of a resistor (16 kΩ) and a thermistor (150 kΩ), and V1 is a potential at a connection point SS. T1 is a temperature of the IGBT casing. T2 is an anode temperature of the magnetron.

When the microwave oven is operated under the above conditions, T1 and T2 rise at steep gradients (the current of the IGBT at this moment is 16 A) but the resistance of the thermistor decreases. Therefore, when V1 becomes close to 3.5 V owing to the invention near a point C in the first stage from near 6.4 V in the steady state, the power fed to the IGBT is halved (the current of the IGBT at this moment is 8.5 A). Therefore, the gradients of the temperatures T1 and T2 of the IGBT that were sharply rising at steep gradients are greatly relaxed at the point C.

However, the temperature of the IGBT still continues to rise though the gradient of T1 is relaxed. V1 remains constant for a while (30 to 40 seconds) but the value of the thermistor starts decreasing, and V1, too, decreases and becomes an input to the comparator at a point D in the second stage. Therefore, the gradient of T1 is relaxed, T2 that was rising starts decreasing, and the operation is continued (the current of the IGBT at this moment is 4 A). Then, the operation is halted at a point E (6 minutes after the start of the heating operation) in excess of 150° C. while T1 is still varying along a loose gradient.

As described above, even in case an accident may occur such as the fan of the microwave oven is locked, the invention gives attention to that the IGBT is not easily broken down by the heat. Besides, the thermistor detector portion of the invention has a small thermal time constant enabling the temperature to be quickly detected. The invention further continues the operation in the power-down control mode without readily halting the heating, i.e., continues the operation for as long as 6 minutes. The heating operation of 6 minutes makes it possible to carry out almost all sorts of cooking. Therefore, the user is allowed to continue the cooking without at all feeling uneasy.

Fourth Embodiment

Figure 8A:
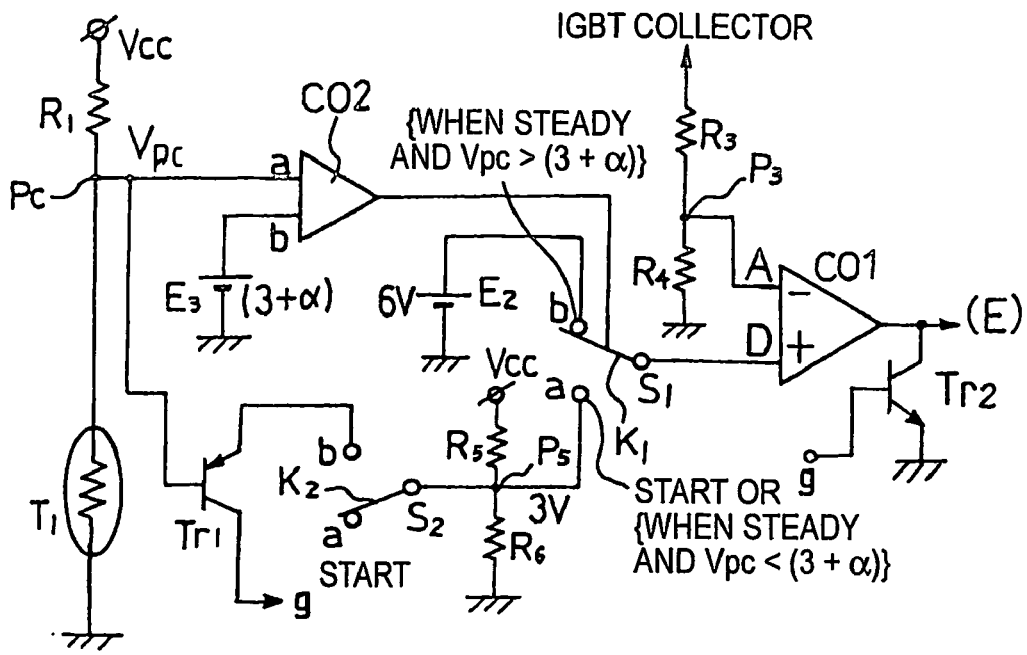
Figure 8B:
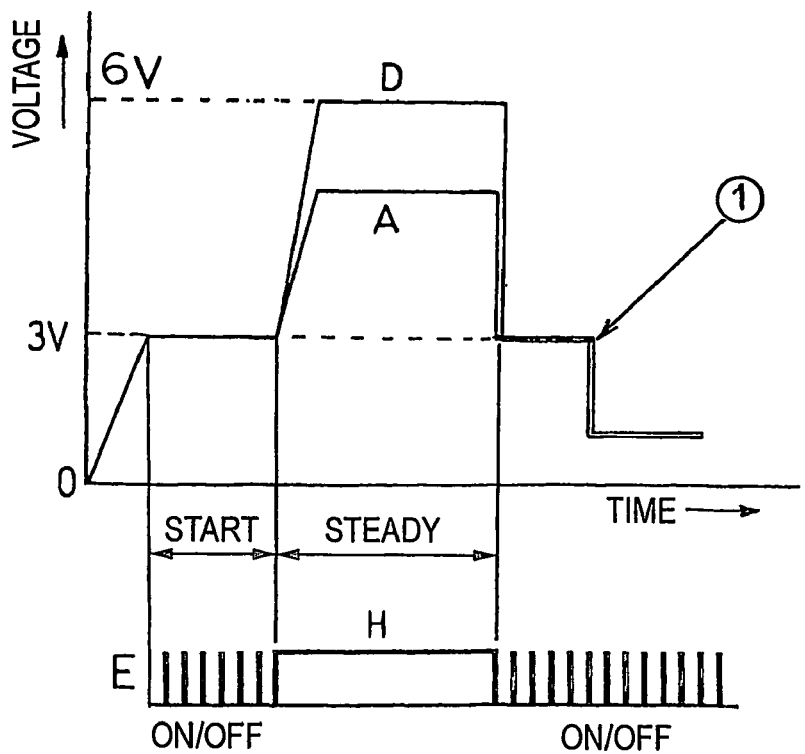
Figure 9:
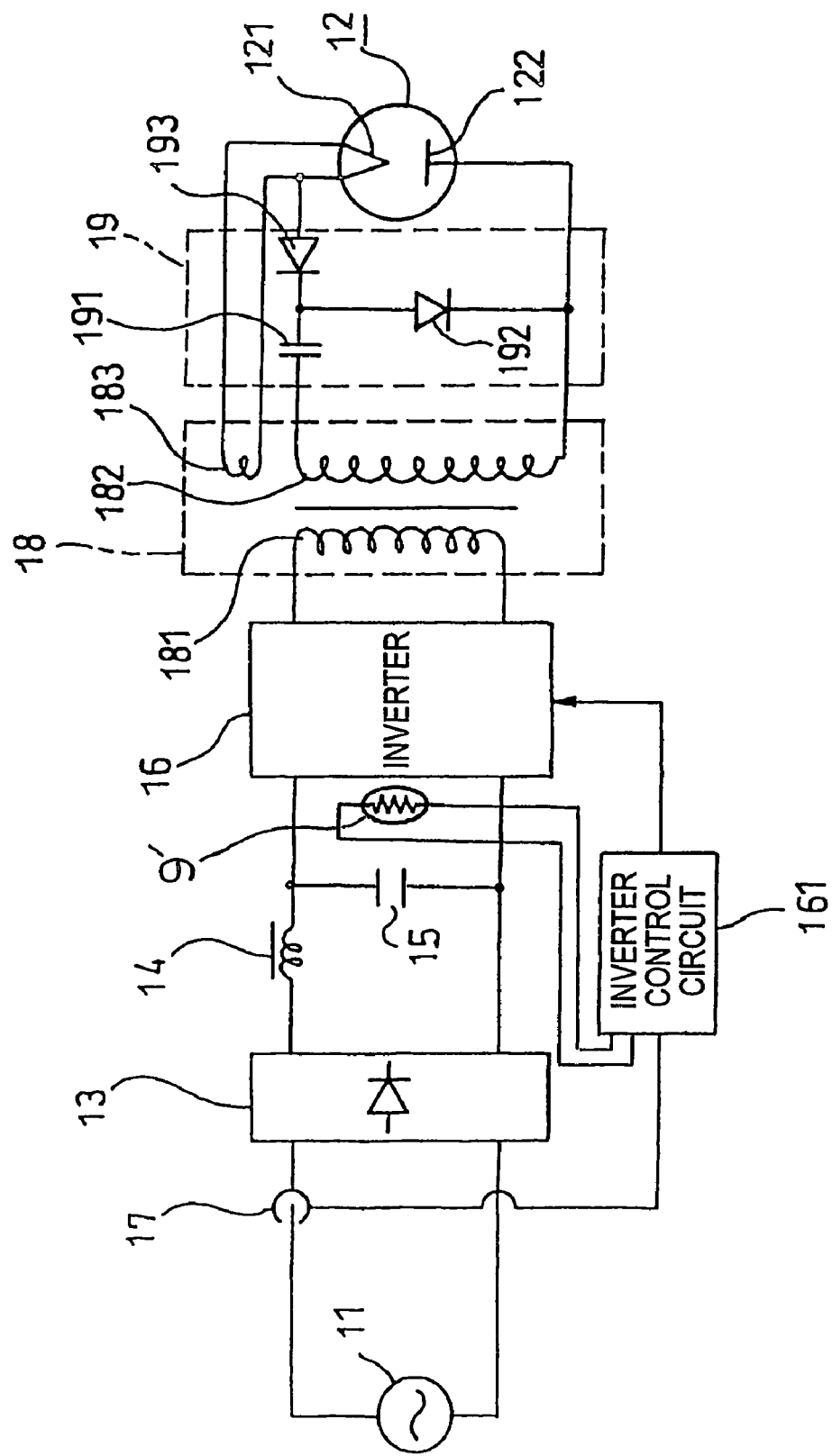
FIG. 9 is a diagram illustrating a conventional power source for driving a magnetron with a thermistor.

FIGS. 8A and 8B are diagrams illustrating a fourth power-down control system according to the invention, wherein FIG. 8A is a circuit diagram and FIG. 8B is a diagram illustrating the operation of a comparator.

The fourth system is a modification of the third control operation. A feature resides in that in the third system, a transistor Tr2 is inserted between the output terminal of the comparator CO1 and the earth, and an output signal (collector current) of the transistor Tr1 is applied as an on/off control signal to the base of the transistor Tr2. The circuit is the same in other respects. In FIGS. 5A and 5B, when the temperature detected by the thermistor is further raised (①) in FIG. 5B), the reference signal of 3 V is further lowered according to the temperature detected by the thermistor. In FIGS. 8A and 8B, on the other hand, when the temperature detected by the thermistor is further raised (①) in FIG. 8B), the transistor Tr2 is turned on due to the transistor Tr1, whereby the output of the comparator CO1 is forcibly lowered down to an emitter-collector conduction potential of the transistor Tr2, enabling the power to be further decreased.

As described above, even in case the fan has failed to revolve due to some cause, the inverter unit continues the operation without shutting off the power source unlike that of the related art. When the resistance of the thermistor decreases down to a predetermined value accompanying an increase in the temperature of the IGBT, the output of the inverter is greatly decreased down in two steps. Therefore, a person who is cooking is allowed to continue the cooking simply feeling that the heating temperature is slightly low without causing the IGBT in the high-frequency dielectric heating device to be broken down.

Fifth Embodiment

Next, the printed board with a thermistor for protecting the IGBT of the invention will now be described with reference to the FIGS. 11 to 12C.

In this invention, a feature resides in that the thermistor 309 (see FIG. 11) for detecting the temperature of the IGBT 16a is not attached to the package portion of the IGBT 16a or to the heat-radiating fins in a conventional manner, but is directly attached to the emitter leg of the IGBT (16a) and is soldered not on the side of the heat-radiating fins but on the soldering surface on the back surface of the printed board 306 and, besides, the thermistor that is used is a chip thermistor.

The temperature data (resistance) of the thermistor lowers the potential at a connection point to the resistor 163 accompanying a rise in the temperature of the IGBT (16a). The potential at the connection point is input to the inverter control circuit 161 to suppress the heating.

Figure 11:
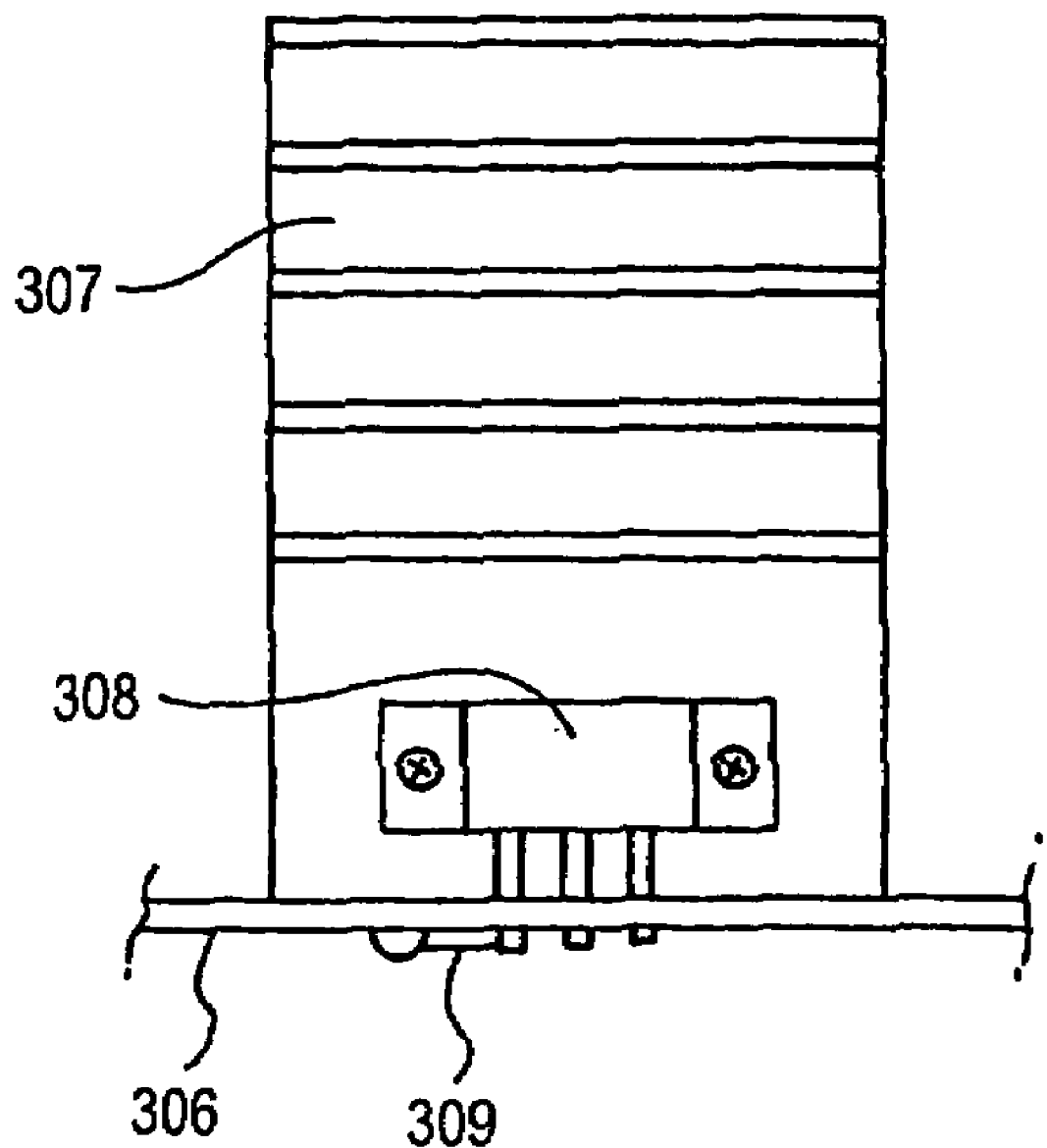
FIG. 11 is a front view illustrating a printed board according to the invention.

FIG. 11 illustrates a printed board on which the chip thermistor is mounted according to the invention. In FIG. 11, reference numeral 307 denotes heat-radiating fins, 308 denotes the IGBT and 309 denotes the thermistor.

The heat-radiating portion of the IGBT 308 that generates a high temperature is secured to the heat-radiating fins 307, and three legs thereof are inserted in the through holes in the printed board and are soldered on the opposite side (back side, soldering side). The thermistor 309 is a chip thermistor which is directly soldered near to the leg (having the same pattern potential) of the IGBT 16a on the soldering surface on the back side of the printed board 306 instead of the side of the heat-radiating fins.

According to the constitution as described above, the thermistor is a chip which can be quickly mounted by using an automatic machine. Besides, the thermistor directly receives a current flowing through the leg of the IGBT making it possible to detect a value close to the junction temperature of the IGBT.

Further, the thermistor is mounted not on the side of the heat-radiating fins but on the soldering surface on the back side of the printed board without affected by the cooling air. Moreover, the cost is not driven up unlike the prior method.

Figure 12A:
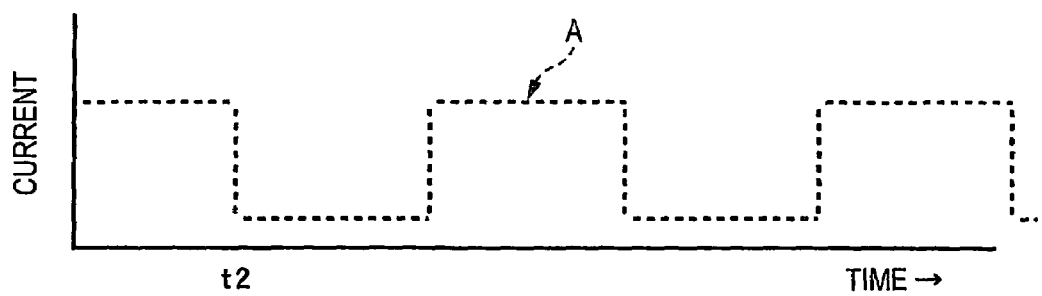
FIGS. 12A, 12B, and 12C are diagrams illustrating input current control waveforms of the IGBT of a case (A) when the thermistor is placed near the leg portion of a diode bridge and of a case (B) of the invention when the thermistor is placed near the leg portion of the IGBT, and further illustrating temperature control waveforms (C) of the IGBT of these cases.
Figure 12B:
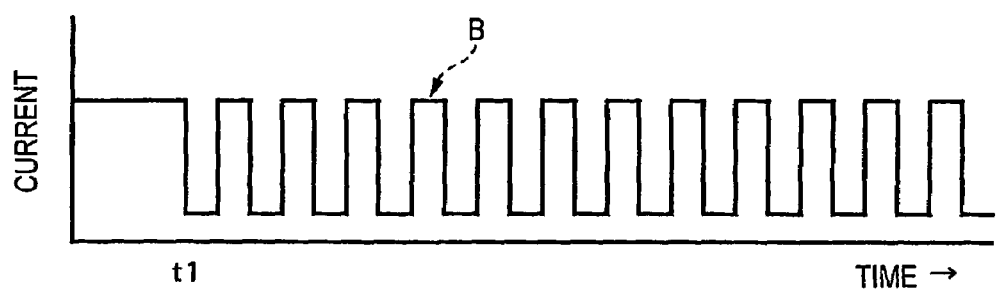
Figure 12C:
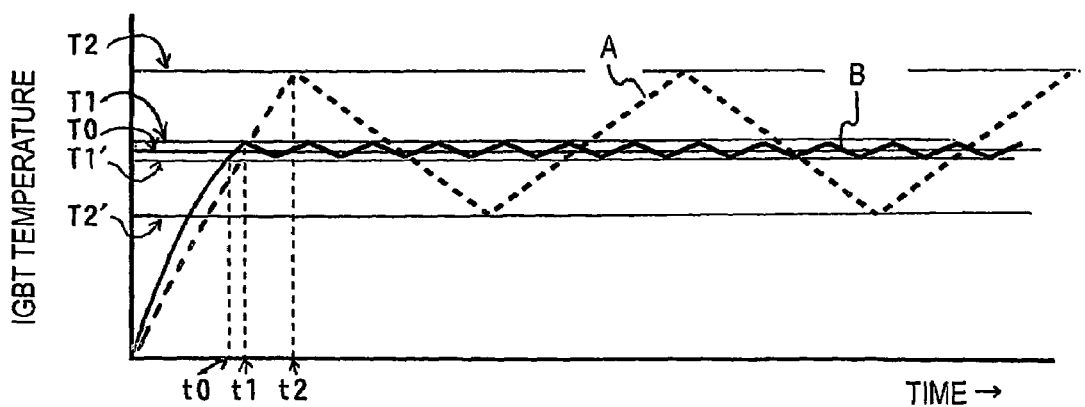
Figure 13A:
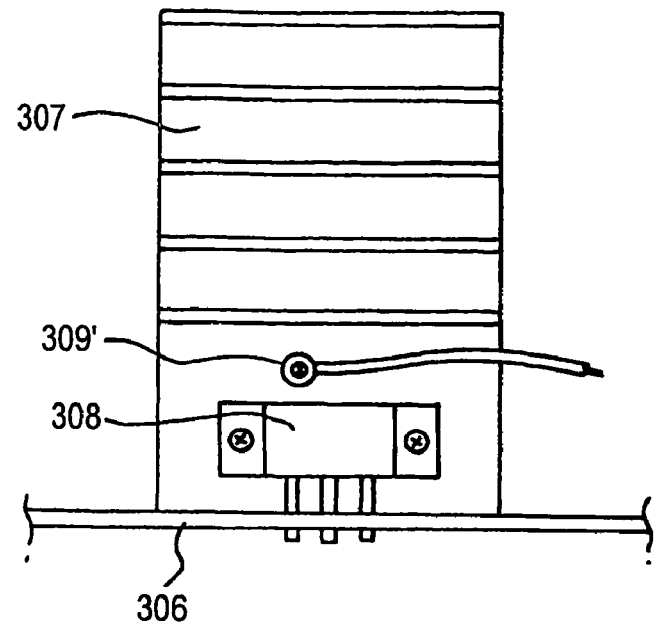
Figure 13B:
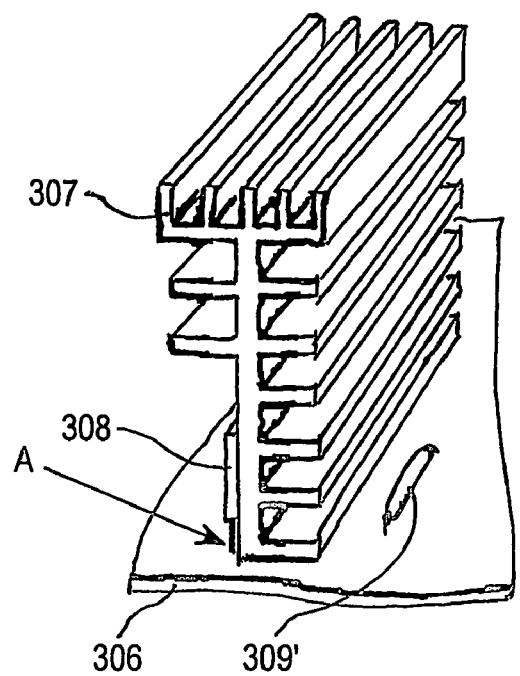

FIGS. 12A, 12B, and 12C are diagrams illustrating power control waveforms of the IGBT of a case (A) when the thermistor is placed near the leg portion of a diode bridge and of a case (B) when the thermistor is placed near the leg portion of the IGBT, and further illustrating temperature control waveforms (C) of the IGBT of these cases.

In FIGS. 12A and 3B, the ordinate represents the input current and the abscissa represents the time. In FIG. 12C, the ordinate represents the temperature of the IGBT, the abscissa represents the time, T0 represents a target (reference) temperature of the IGBT, T1 and T1' represent a maximum value and a minimum value in the temperature control waveform of FIG. 12B, and T2 and T2' represent a maximum value and a minimum value in the temperature control waveform of the case of FIG. 12A.

In FIG. 12C, when a current is fed to the IGBT to operate the inverter, the temperature of the IGBT rises and reaches the target temperature T0 after a time t0.

(A): When the thermistor is placed near the leg portion of the diode bridge, heat is poorly conducted to the thermistor even after the temperature of the IGBT has reached the target temperature T0, and the thermistor cannot quickly detect the temperature. At time t2, the thermistor detects, for the first time, the temperature that has reached the target temperature (at this moment, however, the temperature of the IGBT has been greatly elevated up to T2) and decreases the current that flows into the IGBT (t2 in FIG. 12A). From this moment, the temperature of the IGBT starts decreasing, and at a temperature T2' which is lower than the target temperature T0, the thermistor detects, for the first time, the temperature that is lower than the target temperature T0 (at this moment, however, the temperature of the IGBT has been greatly decreased down to T2') and increases the input current. This operation is repeated hereinafter. According to the conventional method of detecting the temperature as described above, the detected temperature varies over a wide range of between the maximum temperature T2 and the minimum temperature T2'. Therefore, the interval of power control of the IGBT becomes wide (see FIG. 12A) making it difficult to finely control the input current.

(B): When the thermistor is placed near the leg portion of the IGBT according to the invention, on the other hand, the temperature of the IGBT is favorably conducted to the thermistor maintaining good sensitivity. Immediately after a time t1, therefore, the thermistor detects that the target temperature T0 is reached (at this moment, the temperature of the IGBT is slightly increasing to T1) and decreases the input current (t1 in FIG. 12B). From this moment, the temperature of the IGBT starts decreasing. The temperature T1' that has become lower than the target temperature T0 is quickly detected by the thermistor (at this moment, the temperature of the IGBT is slightly decreased down to T1') and the input current is decreased. This operation is repeated in a short period (see FIG. 12B).

According to the temperature detection method using the thermistor placed near the leg portion of the IGBT of this invention as described above, the temperature of the IGBT is maintained in a narrow range of between the maximum temperature T1 and the minimum temperature T1'.

Upon arranging the thermistor near the emitter terminal side of the IGBT as described above, it is allowed to detect a change in the temperature of the IGBT. There, the temperature can be correctly detected as compared to when the thermistor is arranged at the leg of the diode bridge of the same potential, and the temperature detection level can be set to be very close to the temperature of the IGBT.

Besides, the IGBT temperature can be correctly and quickly detected, making it possible to finely control the power of the IGBT, to shorten the power-down period and to stabilize the inverter output as much as possible. Therefore, the temperature of the IGBT can be sensitively monitored, the target temperature of FIG. 12C can be correctly sensed, and the power control of FIG. 12B can be finely executed as compared to the case of FIG. 12A. Then, the temperature of the IGBT is stabilized as illustrated in the diagram of IGBT temperature of (B) in FIG. 12B, whereby the power is easily controlled and the cooking performance is less affected.

The present invention is based on Japanese Patent Applications No. 2003-117072 and No. 2003-117073, which are incorporated herein by references. While only certain embodiments of the invention have been specifically described herein, it will be apparent that numerous modifications may be made thereto without departing from the spirit and scope of the invention.

ADVANTAGE OF THE INVENTION

In case the fan suddenly stops revolving due to foreign matter that has bit the fan due to some cause, it was so far judged that the device has become faulty and the cooking had to be interrupted. The invention, however, gives attention to that even in case the fan becomes faulty, the IGBT is not easily broken down by the heat. Besides, the thermistor detecting portion of the invention has a small thermal time constant enabling the temperature to be quickly detected. Therefore, the cooking can be continued. Namely, the power is greatly decreased down when the temperature of the IGBT increases to approach a value at which the IGBT may be thermally broken down, and a cooking person may simply feel that the heating speed has become slightly mild but is allowed to continue the cooking without feeling uneasiness such as the device has become faulty.

According to this invention as described above, there is provided a printed board comprising an inverter circuit for inverting a direct current into an alternating current of a predetermined frequency by switching the IGBT, heat-radiating fins on which the IGBT is mounted to radiate the heat generated by the IGBT, and a thermistor for detecting the temperature of the IGBT, wherein the thermistor is soldered to a leg portion of the IGBT or near to the leg portion thereof exposed on the side of the soldering surface of the printed board. Therefore, the thermistor directly receives a current flowing through the leg of the IGBT making it possible to detect a value close to the junction temperature of the IGBT. Further, the thermistor is mounted not on the side of the heat-radiating fins but on the soldering surface on the back side of the printed board without affected by the cooling air making it possible to correctly detect the temperature of the IGBT.

Moreover, the mounting place is the emitter leg of the IGBT and does not require a high degree of insulation, and the thermistor is inexpensive and is a very small chip which can be quickly mounted by using an automatic machine without driving up the cost unlike the related art.

The invention claimed is:

1. A high-frequency dielectric heating device for heat-treating a material to be heated, comprising:
   a microwave output unit including:
      an inverter unit for inverting a direct current into an alternating current of a predetermined frequency by switching a semiconductor switching element by using an inverter control circuit,
      heat-radiating fins on which the semiconductor switching element is mounted to radiate the heat generated by the semiconductor switching element,
      a printed board having a thermistor for dectecting the temperature of the semiconductor switching element, the thermistor being soldered to a leg portion of the semiconductor switching element or near to the leg portion thereof on the side of the soldering surface of the printed board,
      a booster transformer for boosting the output voltage of the inverter unit,
      a high-voltage rectifier unit for doubling and rectifying the output voltage of the booster transformer, and
      a magnetron for radiating the output of the high-voltage rectifier unit as microwave; and
   wherein the inverter unit has a power-down control function for permitting the output power of the inverter unit to vary depending upon the resistance of the thermistor after the start of the magnetron.

2. A high-frequency dielectric heating device for heat-treating a material to be heated, comprising:
   a microwave output unit including:
      an inverter unit for inverting a direct current into an alternating current of a predetermined frequency by switching a semiconductor switching element by using an inverter control circuit,
      heat-radiating fins on which the semiconductor switching element is mounted to radiate the heat generated by the semiconductor switching element,
      a printed board having a thermistor for detecting the temperature of the semiconductor switching element, the thermistor being soldered to a leg portion of the semiconductor switching element or near to the leg portion thereof on the side of the soldering surface of the printed board, a booster transformer for boosting the output voltage of the inverter unit, a high-voltage rectifier unit for doubling and rectifying the output voltage of the booster transformer, and a magnetron for radiating the output of the high-voltage rectifier unit as microwaves;

a cooling fan for cooling the switching element; and a controller, wherein the inverter unit has a power-down control function for decreasing the output power of the inverter unit down to a predetermined value when the thermistor has assumed a predetermined resistance, wherein a power down control is performed under a rated power (capacity), and wherein the controller lowers an output of the inverter in case the fan has fault so that the inverter is continued to be operated with the lowered power even if the fan is normally operated.

3. The high-frequency dielectric heating device according to claim 2, wherein the inverter unit is provided with a start control circuit which, at the start of the magnetron, controls the collector voltage of the semiconductor switching element to be lower than that of during the steady-state operation, and the start control circuit is utilized when the output power of the inverter unit is to be decreased down to a predetermined value.

4. A high-frequency dielectric heating device for heat-treating a material to be heated, comprising:

a microwave output unit including:

an inverter unit for inverting a direct current into an alternating current of a predetermined frequency by switching a semiconductor switching element by using an inverter control circuit, heat-radiating fins on which the semiconductor switching element is mounted to radiate the heat generated by the semiconductor switching element, a printed board having a thermistor for detecting the temperature of the semiconductor switching element, the thermistor being soldered to a leg portion of the semiconductor switching element or near to the leg portion thereof on the side of the soldering surface of the printed board, a booster transformer for boosting the output voltage of the inverter unit, a high-voltage rectifier unit for doubling and rectifying the output voltage of the booster transformer, and a magnetron for radiating the output of the high-voltage rectifier unit as microwaves; and a cooling fan for cooling the switching element; and a controller, wherein the inverter unit has a power-down control function for decreasing the output power of the inverter unit down to a predetermined value when the thermistor has assumed a predetermined resistance and, then, for permitting the output power of the inverter unit to vary depending upon the resistance of the thermistor, wherein a power down control is performed under a rated power (capacity), and wherein the controller lowers an output of the inverter in case the fan has fault so that the inverter is continued to be operated with the lowered power even if the fan is normally operated.

5. The high-frequency dielectric heating device according to any one of claims 1 to 4, wherein the output power of the inverter unit is decreased down to a predetermined value when the thermistor has assumed the predetermined resistance.

6. A printed board with a thermistor comprising:

an inverter unit for inverting a direct current into an alternating current of a predetermined frequency by switching a semiconductor switching element;

heat-radiating fins on which the semiconductor switching element is mounted to radiate the heat generated by the semiconductor switching element, the heat-radiating fins being provided on a first side of the printed board; and a thermistor provided on a second side of the printed board for detecting the temperature of the switching element, wherein the switching element is mounted to the printed board such that a body of the switching element is on the first side of the printed board and at least one leg portion extends through the printed board and is soldered to the second side of the printed board, wherein the thermistor is soldered to the at least one leg portion of the switching element or near to the at least one leg portion thereof exposed on the second side of the printed board.

7. The printed board with a thermistor according to claim 6, wherein the semiconductor switching element is an insulated gate bipolar transistor.

8. The printed board with a thermistor according to claim 7, wherein the leg portion is an emitter leg of the insulated gate bipolar transistor.

9. The printed board with a thermistor according to any one of claims 6 to 8, wherein the thermistor is a chip thermistor.

10. A high-frequency dielectric heating device for heat-treating a material to be heated, comprising:

a microwave output unit including:

a printed board mounting an inverter unit, heat-radiating fins and a thermistor, a booster transformer for boosting the output voltage of the inverter unit, a high-voltage rectifier unit for doubling and rectifying the output voltage of the booster transformer, and a magnetron for radiating the output of the high-voltage rectifier unit as microwaves; and wherein the inverter unit is the one mounted on a printed board with a thermistor according to claim 6.

* * * * *